United States Patent [19]
Amemiya et al.

[11] Patent Number: 5,349,196
[45] Date of Patent: Sep. 20, 1994

[54] ION IMPLANTING APPARATUS

[75] Inventors: Kensuke Amemiya, Katsuta; Yoshimi Hakamata, Hitachi; Katsumi Tokiguchi, Mito; Noriyuki Sakudo, Hitachi, all of Japan

[73] Assignee: Hitachi, Ltd., Tokyo, Japan

[21] Appl. No.: 43,794

[22] Filed: Apr. 7, 1993

[30] Foreign Application Priority Data

Apr. 10, 1992 [JP] Japan ................................. 4-090734

[51] Int. Cl.$^5$ ............................................ H01J 37/317
[52] U.S. Cl. ........................ 250/492.21; 250/396 ML
[58] Field of Search ............... 250/492.21, 492.3, 292, 250/396 ML

[56] References Cited

U.S. PATENT DOCUMENTS 3,909,305   9/1975   Boroffka et al. ............... 250/492.21

FOREIGN PATENT DOCUMENTS

| 163745 | 12/1985 | European Pat. Off. |
| 375169 | 6/1990 | European Pat. Off. |
| 60-121656 | 6/1985 | Japan |
| 4-51446 | 2/1992 | Japan ........................ 250/492.21 |

OTHER PUBLICATIONS

Hofmann et al, Nuclear Instruments and Methods in Physics Research B50, 1990, pp. 478–480.

Yamada et al, Nuclear Instruments and Methods in Physics Research B37/38, 1989, pp. 94–97.

Amemiya et al, Nuclear Instruments & Methods in Physics Research, Section—B: Beam Interactions with Materials and Atoms, vol. B55, No. 1–4, Apr. 1991, Amsterdam, NL, pp. 339–342.

DiBitonto et al, Nuclear Instruments & Methods in Physics Research, Section—B: Beam Interactions with Materials and Atoms, vol. B21, No. 2–4, Mar. 1987, Amsterdam, NL, pp. 155–157.

*Primary Examiner*—Jack I. Berman
*Attorney, Agent, or Firm*—Antonelli, Terry, Stout & Kraus

[57] ABSTRACT

An ion implanting apparatus includes a magnetic quadrupole lens disposed between an ion source and an RFQ accelerator. The magnetic quadrupole lens carries out mass spectrometry of an ion beam extracted from the ion source while converging the ion beam, and reduces the divergence of the ion beam due to the space charge effect as compared to an electrostatic quadrupole lens. The use of the magnetic quadrupole lens makes it possible to utilize to a maximum extent the ion beam extracted from the ion source and to restrict to a minimum the reduction in the current of the ion beam during passage of the ion beam, thereby making it possible to generate a high-energy ion beam having a large current on the order of several tens of milliamperes.

7 Claims, 1 Drawing Sheet

ION IMPLANTING APPARATUS

BACKGROUND OF THE INVENTION

The present invention relates to an ion implanting unit utilizing a radio frequency linear ion accelerator, and relates more particularly to an ion implanting unit suitable for generating a high energy ion beam having a large current.

An ion implanting unit utilizing a conventional radio frequency quadrupole (RFQ) ion accelerator is disclosed in Japanese Patent Unexamined Publication No. JP-A-60-121656. This prior art technology has a characteristic that it can implant high-energy ions having an energy in the range of several hundred keV to several MeV.

FIG. 3 is a block diagram for showing the configuration of the prior art technology.

As shown in this drawing, the conventional ion implanting unit has a basic structure which includes an ion source 1 for generating ions to be implanted into a material to be processed in a vacuum, a sector-type mass spectrometer 6 for carrying out mass spectrometry of an ion beam that has been extracted from this ion source 1, an RFQ accelerator 3 for accelerating ions produced from this mass spectrometer 6 with a radio frequency voltage, and an ion implanting chamber 4 for implanting ions outputted from this RFQ accelerator 3 into the material to be processed.

A conventional example of the case where a quadrupole lens is disposed between the mass spectrometer 6 and the RFQ accelerator 3 for the purpose of converging an ion beam that has been injected into the RFQ accelerator 3 is disclosed, for example, in Nuclear Instruments and Methods in Physics Research B50, 1990, pp. 478-480.

As described above, all of the prior art techniques employ a sector-type mass spectrometer 6 in order to select desired ions out of various kinds of ions which are included in the ion beam that has been extracted from the ion source 1.

Also, when the quadrupole lens is disposed between the mass spectrometer 6 and the RFQ accelerator 3 for the purpose of converging the ion beam that has been incident to the RFQ accelerator 3, all of the prior art techniques employ an electrostatic quadrupole lens as shown in Nuclear Instruments and Methods in Physics Research B37/38, 1989, pp. 94-97.

As described above, according to the prior art techniques, the use of the RFQ accelerator makes it possible to implant high-energy ions but the ion beam that has been extracted from the ion source 1 is not utilized to the maximum extent, so that a current value is reduced to half or below during the passage of the beam from the ion source 1 to the ion implanting chamber 4, with a result that a large current cannot be obtained. The above problem occurs for the following reasons. In the example of FIG. 3, the sector-type mass spectrometer 6 is used to carry out mass spectrometry of the ion beam that has been extracted from the ion source 1. The sector-type mass spectrometer 6, however, provides low transmissivity because it utilizes a weak convergent lens. Further, when the electrostatic quadrupole lens is disposed between the mass spectrometer 6 and the RFQ accelerator 3, the electrostatic quadrupole lens separates electrons in the beam, and therefore it is not possible to restrict the divergence of the beam due to the space charge effect, with a result that the ion beam cannot be sufficiently converged to the incident opening of the RFQ accelerator 3.

SUMMARY OF THE INVENTION

It is an object of the present invention to provide an apparatus for generating a high-energy ion beam having a large current.

The above-described object can be achieved by an apparatus which includes an ion source for generating a beam including various kinds of ions, a multipole lens for carrying out mass spectrometry of a beam including various kinds of ions from the ion source while converging the beam, a radio frequency accelerator for accelerating an ion beam from the multipole lens to a predetermined energy level with a radio frequency field, and an ion implanting chamber for implanting an ion beam from the radio frequency accelerator into a material to be processed.

The above-described object can be achieved by using a magnetic field quadrupole lens as the multipole lens.

The above-described object can be achieved by using a magnetic field quadrupole lens having at least three stages.

The above-described object can be achieved by using a quadrupole particle accelerator including quadruple electrodes having mutually facing planes formed in a wave shape as the radio frequency accelerator.

The above-described object can be achieved by using a radio frequency accelerator including an accelerating tube and a radio frequency resonance circuit disposed outside of the accelerating tube.

The above-described object can be achieved by disposing between the radio frequency accelerator and the ion implanting chamber a beam deflector for varying an angle at which ions are implanted into the material to be processed.

The above-described object can be achieved by using a magnetic analyzer for the beam deflector.

In order to achieve the above-described object, the present invention utilizes both a mass spectrometry function and a convergence function of a multipole lens.

Among multipole lenses, a quadrupole lens is used to converge a charged particle beam width an electrostatic field or a magnetic field, and the quadrupole lens also has a function of selecting desired ions. Convergence characteristics of a beam are determined by mass, velocity, and the number of electric charges of a particle, as is the case with a normal sector-type mass spectrometer. When desired ions have been converged, the rest of the ions are diverged through entirely different orbits. Thus, the quadrupole lens also has a mass spectrometry function similar to that of the sector-type mass spectrometer.

The quadrupole lens can carry out mass spectrometry of a beam over a short distance with the beam traveling in a straight direction because the quadrupole lens uses a strong convergent lens. Thus, the quadrupole lens can pass the beam with a transmissivity of almost 100%, which is at least twice the transmissivity of the conventional sector mass spectrometer that utilizes a weak convergent lens. Accordingly, the use of the quadrupole lens makes it possible to provide a simple and compact unit which has both the mass spectrometry function and the lens convergence function while maintaining the beam current value at a level of at least twice that of the conventional sector-type mass spectrometer.

While the sector-type mass spectrometer has not enabled the use of an ion source having a large ion extraction area because of its small allowance area (acceptance) for beam passage, the use of the quadrupole lens makes it possible to use an ion source having a larger ion extraction area and makes it possible to improve the current value of the beam incident to the RFQ accelerator by about five times to a level on the order of several tens of milliamperes.

As compared with the electrostatic type quadrupole lens, the magnetic field type quadrupole lens barely deviates electrons in the beam. Therefore, the divergence of the beam due to the space charge effect can be restricted to the largest extent, so that a large current ion beam on the order of several tens of milliamperes can be sufficiently converged to the incident opening of the RFQ. This is explained as follows. While the force acting on a charged particle due to the electrostatic field is determined by qE where E represents the electric field strength and q represents the electric charge of the particle, the force acting on a charged particle due to the magnetic field (magnetic flux density: B) is determined by qvB in proportion to the velocity v, so that a low-speed electron in the beam is not deviated from the beam even if it is influenced by the magnetic field.

A quadrupole lens of at least three stages has a larger degree of freedom than a quadrupole lens of two stages or less and can converge a beam at any distance in any magnification of an image at the same magnification for both horizontal and vertical directions. Therefore, even if the size of the incident opening of the RFQ has changed, an optimum condition for an incident beam can be obtained without changing the distance from the lens to the RFQ accelerator. Thus, it is possible to generate a high-energy ion beam having a large current on the order of several tens of milliamperes with various kinds of ions.

Among radio frequency accelerators, the RFQ accelerator has the best acceleration efficiency per unit length, and an RFQ accelerator having an accelerating tube and a radio frequency resonance circuit disposed outside of the accelerating tube makes it possible to vary the output energy of the accelerator. Accordingly, with the above-described arrangement, it is possible to make the whole unit size to be compact and it is also possible to generate a high-energy ion beam with any desired level of energy from several hundred keV to several MeV having a large current on the order of milliamperes to several tens of milliamperes with various kinds of ions.

DESCRIPTION OF THE PREFERRED EMBODIMENTS

Two embodiments of the present invention will be explained below with reference to the drawings.

A First Embodiment

Figure 1:
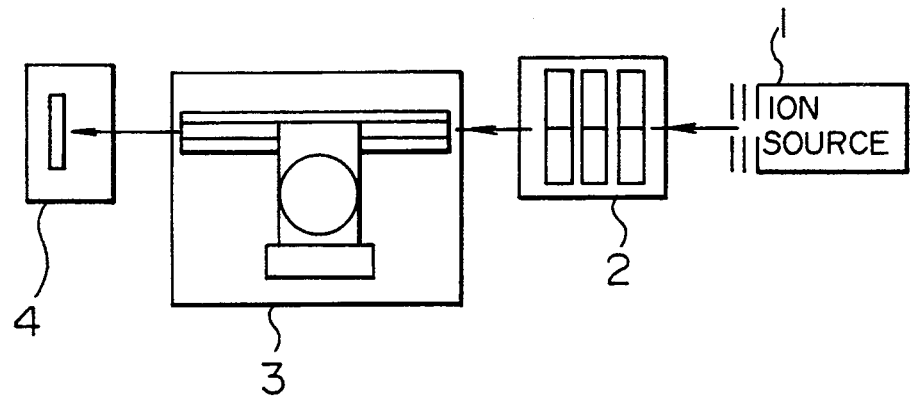
FIG. 1 is a block diagram for showing the configuration of a first embodiment of the present invention.

FIG. 1 is a block diagram for showing the configuration of a first embodiment of the present invention.

As shown in the drawing, the present unit is an ion implanting unit, having a quadrupole lens 2 disposed between an ion source 1 and an RFQ accelerator 3, for generating a high-energy ion beam having a large current on the order of several tens of milliamperes.

The ion source 1 is a multi-charged ion source of the microwave discharge type, which has a multipole magnetic field formed with an octupole permanent magnet disposed on the outer periphery of a cylindrical plasma chamber, and which also has a mirror field formed by solenoid coils in the axial direction. Based on discharging of a microwave in the magnetic field, a high-density ion beam of 30 mA/cm$^2$ or above can be extracted from an extraction electrode. An argon ion beam of 30 mA was able to be extracted from an extraction hole having a maximum diameter of 10 mm.

The quadrupole lens 2 is a three-staged magnetic quadrupole lens which uses three single lenses with a lens length of 110 mm. A maximum exciting current is 70 A, and an ion beam of monovalent to trivalent argon of ten and several milliamperes can be converged to the RFQ incident hole having a diameter of 10 mm. Further, if the extraction area of the ion source is expanded, a current value of several tens of milliamperes can be secured.

The RFQ accelerator 3 is an RFQ accelerator of the external resonance circuit type which has an accelerating tube and a radio frequency resonance circuit disposed outside of the accelerating tube, and uses an RFQ electrode having a total length of 2.3 m. The resonance circuit is formed by a variable capacitor and variable inductor. By providing a circuit which oscillates in the region of 10 MHz to 30 MHz, it is possible to obtain a high-energy beam in the region from 0.5 MeV to 4 MeV. A maximum radio frequency power inputted to the RFQ accelerator 3 is 50 kW.

The implanting chamber 4 can have tens of wafers loaded on a rotating disk when ions are to be implanted into a silicon semiconductor wafer, and in the case of processing a single article such as an industrial material, a target holder having a rotation axis of at least three axes can be installed in the implanting chamber. With this arrangement, high-energy implanting of ions into a semiconductor wafer, an industrial material, etc., can be achieved at a high throughput level similar to the level achieved by a conventional ion implanting unit having a large current and a medium energy of 200 keV or below.

A Second Embodiment

Figure 2:
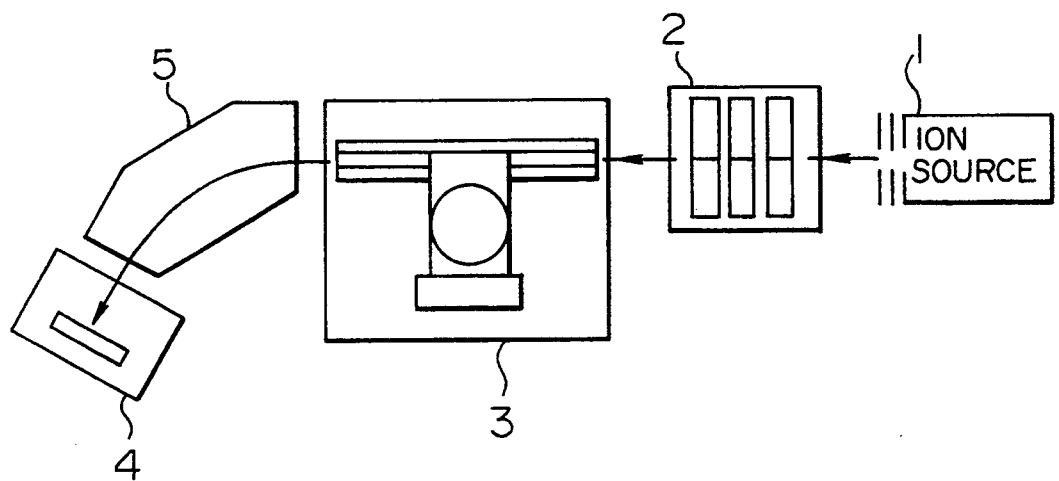
FIG. 2 is a block diagram for showing the configuration of a second embodiment of the present invention.
Figure 3:
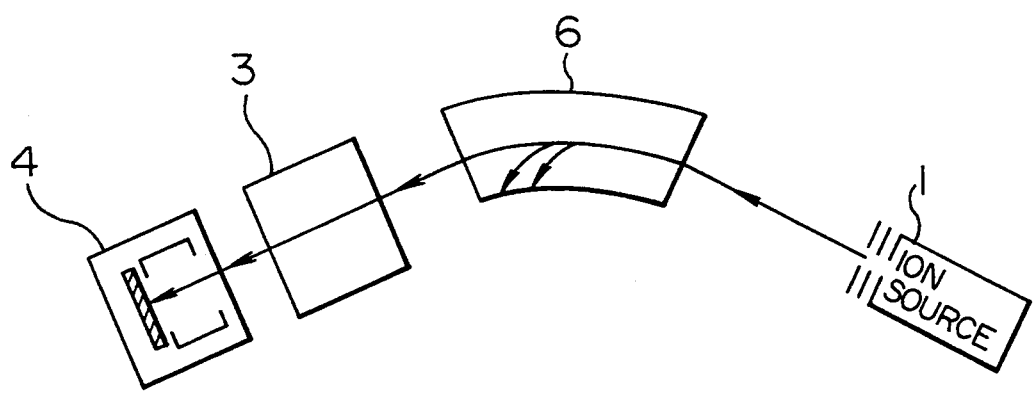
FIG. 3 is a block diagram for showing the configuration of a prior art technique.

FIG. 2 is a block diagram for showing the configuration of a second embodiment of the present invention.

The present embodiment is an ion implanting unit for implanting an ion beam into a material to be processed after the ion beam has been deflected. The ion implanting unit of the present embodiment has a quadrupole lens 2 disposed between an ion source 1 and an RFQ accelerator 3 in the same manner as in the first embodiment to produce a high-energy ion beam having a large current on the order of several tens of milliamperes, and a deflector 5 for deflecting the accelerated ion beam from the RFQ accelerator 3 to produce a deflected ion beam which is implanted into the material to be processed. With this structure, it is possible to vary the angle at which the ion beam is implanted into the material to be processed and also to process a large-area material to be processed by scanning the ion beam. The deflector 5 can also act as a velocity filter for removing a fine quantity low-energy beam included in the accelerated beam to thereby improve the purity of the beam to be implanted into the material to be processed.

In the first and second embodiments, materials that can be processed and installed in the ion implanting chamber 4 include semiconductor materials such as silicon, gallium arsenide, and indium phosphide, various metal materials such as steel and stainless steel, ceramic materials such as aluminum and boron nitride, and other materials such as glass materials, organic materials, etc. Further, the materials to be processed may have various shapes such as a plane shape such as for a semiconductor wafer and complex shapes such as for gears and engine parts, etc., so that these embodiments can be applied to processing a wide range of surfaces.

As described above, according to the present embodiments, it is possible to utilize an ion beam extracted from the ion source to a maximum extent and to restrict a reduction of a current value during passage of the beam to a minimum. Accordingly, it is possible to generate a high-energy ion beam of any energy level ranging from several hundred keV to several MeV having a large current on the order of tens of milliamperes which is about five times higher than the conventional level.

Further, since mass spectrometry and convergence are carried out at the same time in a linear beam, it is possible to provide a unit with a simple linear structure and also with a more compact size overall than that of the conventional unit.

Further, it is possible to provide an ion processing unit which can not only utilize an ion beam on the order of MeV in the production process of a semiconductor device but also can reduce time required for improving the quality of the surface layer of materials such as metals and ceramics, so that the ion processing unit is suitable for mass production of these materials.

According to the present invention, a multipole lens is disposed between the ion source and the radio frequency accelerator so that the multipole lens can converge the ion beam from the ion source and also can carry out mass spectrometry of the beam while increasing a beam current value of the beam incident to the RFQ accelerator, and the RFQ accelerator can accelerate the ion beam and generate a high-energy ion beam having a large current.

We claim:

1. An ion implanting unit comprising:
   an ion source for generating a beam including various kinds of ions,
   a multipole lens for carrying out mass spectrometry of a beam including various kinds of ions from said ion source while converging the beam,
   a radio frequency accelerator for accelerating an ion beam from said multipole lens to a predetermined energy level with a radio frequency field, and
   an ion implanting chamber for implanting an ion beam from said radio frequency accelerator into a material to be processed.

2. An ion implanting unit according to claim 1, wherein said multipole lens is a magnetic field type quadrupole lens.

3. An ion implanting unit according to claim 2, wherein said magnetic field type quadrupole lens has at least three stages.

4. An ion implanting unit according to claim 1, wherein said radio frequency accelerator is a quadrupole particle accelerator including quadrupole electrodes having mutually facing planes formed in a wave shape.

5. An ion implanting unit according to claim 1, wherein said radio frequency accelerator includes an accelerating tube and radio frequency resonance circuit disposed outside said accelerating tube.

6. An ion implanting unit according to claim 1, further comprising a beam deflector disposed between said radio frequency accelerator and said ion implanting chamber, said beam deflector being for varying an angle at which ions are implanted into said material to be processed.

7. An ion implanting unit according to claim 6, wherein said beam deflector is a magnetic analyzer.

* * * * *